(12) United States Patent
Kim et al.

(10) Patent No.: US 11,515,287 B2
(45) Date of Patent: Nov. 29, 2022

(54) DEVICE AND METHOD FOR REEL-TO-REEL LASER REFLOW

(71) Applicant: LASERSSEL CO., LTD., Asan-si (KR)

(72) Inventors: Byung Rock Kim, Incheon (KR); Wan Ki Cho, Daejeon (KR); Jae Joon Choi, Gwangju-si Gyeonggi-do (KR)

(73) Assignee: LASERSSEL CO., LTD., Asan-si (KR)

( * ) Notice: Subject to any disclaimer, the term of this patent is extended or adjusted under 35 U.S.C. 154(b) by 0 days.

(21) Appl. No.: 17/576,464

(22) Filed: Jan. 14, 2022

(65) Prior Publication Data
US 2022/0157769 A1 May 19, 2022

Related U.S. Application Data

(62) Division of application No. 16/305,309, filed as application No. PCT/KR2017/006039 on Jun. 9, 2017, now Pat. No. 11,257,783.

(30) Foreign Application Priority Data

Jun. 10, 2016 (KR) .................. 10-2016-0072647

(51) Int. Cl.
*B23K 1/00* (2006.01)
*H01L 23/00* (2006.01)
(Continued)

(52) U.S. Cl.
CPC ............ *H01L 24/83* (2013.01); *B23K 1/0016* (2013.01); *B23K 1/0056* (2013.01);
(Continued)

(58) Field of Classification Search
CPC ............ B23K 1/0056; B23K 2101/40; B23K 1/0016; B23K 1/012; B23K 1/20;
(Continued)

(56) References Cited

U.S. PATENT DOCUMENTS 5,244,143 A * 9/1993 Ference ............... B23K 3/0607
228/56.3
5,652,645 A 7/1997 Jain
(Continued)

FOREIGN PATENT DOCUMENTS

CN 101533482 A 9/2009
CN 103999560 A 8/2014
(Continued)

OTHER PUBLICATIONS

International Search Report for PCT/KR2017/006039 dated Oct. 25, 2017.
(Continued)

*Primary Examiner* — Erin B Saad
(74) *Attorney, Agent, or Firm* — Hauptman Ham, LLP (57) ABSTRACT

The present invention relates to a reel-to-reel layer reflow method, which emits a uniformized laser beam, which can easily adjust the emission area, and which is for the purpose of improving productivity. An embodiment of the present invention provides a reel-to-reel layer reflow method comprising the steps of: a) transferring a substrate, which has been wound in a roll type, to one side while unwinding the same; b) forming a solder portion on the substrate; c) seating an emission target element on the solder portion and seating a non-emission target element on the substrate; d) surface-emitting a laser beam to the solder portion, on which the emission target element is seated, such that the emission target element is attached to the substrate; e) inspecting the substrate structure manufactured through said step d); and f) winding the substrate structure in a roll type.

5 Claims, 4 Drawing Sheets

(51) Int. Cl.
*B23K 1/005* (2006.01)
*B23K 3/06* (2006.01)
*B23K 3/08* (2006.01)
*B23K 101/40* (2006.01)

(52) U.S. Cl.
CPC .............. *B23K 3/0692* (2013.01); *B23K 3/08* (2013.01); *H01L 24/75* (2013.01); *B23K 2101/40* (2018.08); *H01L 2224/759* (2013.01); *H01L 2224/75261* (2013.01); *H01L 2224/75651* (2013.01); *H01L 2224/83224* (2013.01); *H01L 2224/83815* (2013.01); *H01L 2224/83908* (2013.01)

(58) Field of Classification Search
CPC .............. B23K 26/0608; B23K 26/073; B23K 26/354; B23K 35/025; B23K 35/262; B23K 35/264; B23K 35/3613; B23K 3/00; B23K 3/0607
See application file for complete search history.

(56) References Cited

U.S. PATENT DOCUMENTS

| | | | | |
|---|---|---|---|---|
| 6,665,151 | B1* | 12/2003 | Bonin | G11B 5/56 |
| 2002/0020346 | A1* | 2/2002 | Doyle | H05K 3/1216 |
| | | | | 118/301 |
| 2003/0084563 | A1 | 5/2003 | Ohkubo et al. | |
| 2003/0116547 | A1* | 6/2003 | Choi | B23K 1/0056 |
| | | | | 219/121.85 |
| 2005/0242161 | A1* | 11/2005 | Shi | H05K 3/3452 |
| | | | | 228/180.21 |
| 2006/0043597 | A1* | 3/2006 | Wada | C22C 12/00 |
| | | | | 257/772 |
| 2015/0229108 | A1* | 8/2015 | Steigerwald | H01S 5/34333 |
| | | | | 372/45.01 |
| 2015/0351254 | A1* | 12/2015 | Driscoll | B23K 1/012 |
| | | | | 126/263.01 |
| 2020/0091108 | A1* | 3/2020 | Kim | H01L 24/81 |
| 2020/0321310 | A1* | 10/2020 | Kim | B23K 1/0016 |

FOREIGN PATENT DOCUMENTS

| | | |
|---|---|---|
| JP | 1986-129039 U | 8/1986 |
| JP | 07183654 A | 7/1995 |
| JP | 2002076589 A | 3/2002 |
| JP | 2005223241 A | 8/2005 |
| JP | 2013098338 A | 5/2013 |
| KR | 10-1999-0043897 A | 6/1999 |
| KR | 10-2011-0029911 A | 3/2011 |
| KR | 10-1047599 B1 | 7/2011 |
| KR | 10-2012-0037543 A | 4/2012 |
| KR | 10-1385270 B1 | 4/2014 |
| KR | 10-2014-0058043 A | 5/2014 |
| KR | 10-2014-0087049 A | 7/2014 |
| WO | 2013065861 A1 | 5/2013 |

OTHER PUBLICATIONS

Japanese Office Action dated Apr. 16, 2019 in connection with counterpart Japanese Patent Application No. 2018-562340.
Chinese Office Action dated Jul. 10, 2020 in connection with counterpart Chinese Patent Application No. 201780033018.3.

* cited by examiner

DEVICE AND METHOD FOR REEL-TO-REEL LASER REFLOW

CROSS REFERENCE TO RELATED APPLICATION

The present application is a Divisional Application of U.S. patent application Ser. No. 16/305,309 filed on Nov. 28, 2018, which is a national stage filing under 35 U.S.C § 371 of PCT application number PCT/KR2017/006039 filed on Jun. 9, 2017 which is based upon and claims the benefit of priority to Korean Patent Application No. 10-2016-0072647 filed on Jun. 10, 2016 in the Korean Intellectual Property Office. The disclosures of the above-listed applications are hereby incorporated by reference herein in their entirety.

TECHNICAL FIELD

Exemplary embodiments according to the invention relate to a device and method for reel-to-reel laser reflow.

BACKGROUND ART

A reflow process, in general, is performed to fix a semiconductor element to a substrate. A mass reflow process includes seating a substrate attached with a solder material on a conveyor belt, and by the conveyor belt, passing the substrate through a heating section provided with an infrared heater or a ceramic heater. The infrared heater or ceramic heater is mounted above and below the conveyor belt, and applies heat to the solder material on the substrate to thereby attach a semiconductor element to the substrate. Since the mass reflow process requires at least minutes to apply heat to the solder material using the infrared heater or ceramic heater to combine the semiconductor element to the substrate, such a scheme is not economical.

In recent times, a thin substrate structure including a substrate combined with a semiconductor element is used, including the use of a film substrate, wherein a semiconductor element, such as a passive element, an integrated circuit (IC) element, is attached to a single substrate. During the mass reflow process, the film substrate may experience thermal deformation (expansion and damage), such that the IC element after undergoing the mass reflow process may have difficulty being bonded on a predetermined position in a normal manner. Moreover, the mass reflow process may cause an air gap between a lower surface of the substrate and an upper surface of the conveyor belt. Thus, part of the heat emitted from the infrared heater is trapped in the air gap and remains therein, thereby causing thermal deformation in the substrate.

Korean Patent Application No. 2012-0037543 discloses a reflow device and method using a laser module. According to Korean Patent Application No. 2012-0037543, a print circuit board formed with a solder ball is preheated using an infrared (IR) lamp, and a lase square beam is emitted to the preheated board to melt the solder ball. The reflow device and method using a laser module in Korean Patent Application No. 2012-0037543 cannot adjust the emission area of a laser beam, and thus, in the case of attaching a semiconductor element, such as a passive element, an IC element, to a single substrate, the IC element would be thermally impacted, thereby causing defects.

China Patent Application No. 101533482 discloses a chip bonding method using laser. According to China Patent Application No. 101533482, a cut face of an anisotropic conductive film is bonded to a recessed portion using laser after loading a chip on the recessed portion in a substrate, and bonds the chip to the substrate using laser. However, China Patent Application No. 101533482 does not disclose any feature of adjusting the emission area of a laser beam.

U.S. Patent Application No. 2003-0084563 discloses a bonding device including a loading reel and an unloading reel for transferring a processed article. However, U.S. Patent Application No. 2003-0084563 also does not disclose any feature of adjusting the emission area of a laser beam.

DISCLOSURE OF INVENTION

Problem to be Solved by the Invention

An objective of the invention is to provide a reel-to-reel laser reflow technique for bonding an emission target element to a substrate by emitting a uniformized laser beam to the substrate.

Additionally, another objective of the invention is to provide a reel-to-reel laser reflow technique capable of adjusting the shape and size of the emission area of the uniformized laser beam according to the shape and position of the emission target element.

The other objectives of the invention will be more clearly understood from the following detailed description of exemplary embodiments.

Means for Solving Problem

In order to achieve the aforementioned objectives, a reel-to-reel laser reflow method according to an exemplary embodiment of the invention includes a) transferring a substrate, which has been wound in a roll type, to one side while unwinding the substrate, b) forming a solder portion on the substrate, c) seating an emission target element on the solder portion and seating a non-emission target element on the substrate, d) emitting a laser square beam to the solder portion, on which the emission target element is seated, such that the emission target element is attached to the substrate, e) inspecting the substrate structure manufactured through the step d), and f) winding the substrate structure in a roll type.

According to another exemplary embodiment of the invention, a reel-to-reel laser reflow device includes a first reel to unwind a substrate wound in a roll type, a transfer unit to transfer the substrate unwound by the first reel, a second reel to control a movement of the substrate, a solder forming unit to form a solder portion on the substrate, an element seating unit to seat an emission target element on the solder portion and seat a non-emission target element on the substrate, an optical unit to adjust an emission area of a laser beam so that a uniformized laser beam is emitted only to the emission target element seated on the solder portion, an inspection unit to inspect the substrate structure attached with the emission target element seated on the solder portion; and a third reel to wind the substrate structure that has passed through the inspection unit.

Effect of the Invention

According one or more exemplary embodiments of the invention, the reel-to-reel laser reflow method can readily adjust the shape and size of the emission area of the laser beam according to the shape and position of the emission target element.

Furthermore, according one or more exemplary embodiments of the invention, the reel-to-reel laser reflow method can attach an emission target element to a substrate by emitting a laser beam to the emission target element for one to two seconds, such that the operation time is reduced compared to a conventional mass reflow process.

Additionally, as no air gap is generated between a conveyor and a substrate, it is possible to prevent damage that may occur to the substrate due to residual heat energy.

BEST MODE(S) FOR CARRYING OUT THE INVENTION

Figure 1:
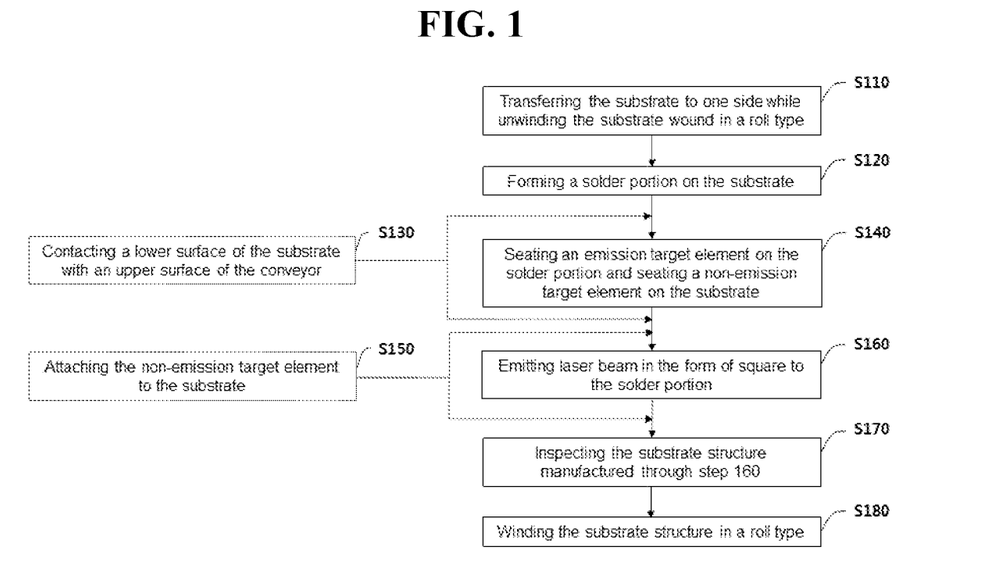
FIG. 1 is a flow chart illustrating a reel-to-reel laser reflow method according to an exemplary embodiment of the invention.
Figure 2:
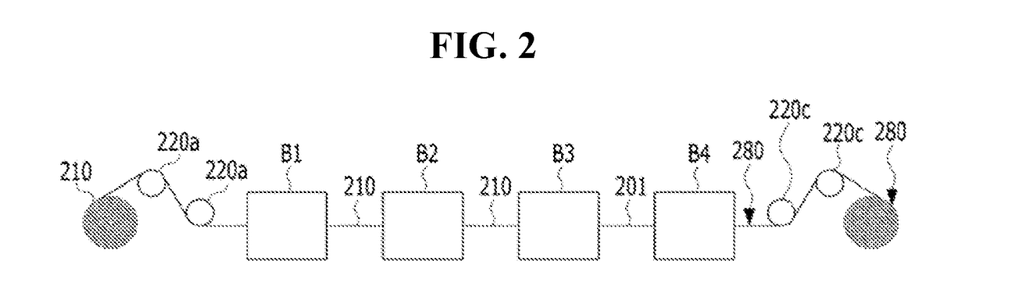
FIG. 2 is a view illustrating an example of an overall process flow of the reel-to-reel laser reflow method according to an exemplary embodiment of the invention.

Referring to FIGS. 1 and 2, a reel-to-reel laser reflow method according to an exemplary embodiment of the invention includes the step of transferring a substrate, which has been wound in a roll type, to one side while unwinding the same (S110). A substrate (210) may comprise a flexible print circuit board (FPCB) in the shape of a roll. The substrate (210) may have a thickness in the range of 0.03 mm to 0.15 mm. A first reel (220a) unwinds the substrate (210), and the substrate (210) unwound by the first reel (220a) is transferred to a third reel (220c).

In FIG. 1, subsequent to S110, the reel-to-reel laser reflow method according to an exemplary embodiment of the invention includes the step of forming a solder portion (S) on the substrate (210) (S120). The solder portion (S) may include a solder ball, a solder paste, etc. S120 may include the step of screen-printing a solder paste on the substrate (210). In section B1 in FIG. 2, the screen-printing step may be performed on the substrate (210).

Referring to FIG. 1, the reel-to-reel laser reflow method according to an exemplary embodiment of the invention includes the step of seating an emission target element (211) on the solder portion (S) and seating a non-emission target element (212) on the substrate (S140). The emission target element (211) refers to a semiconductor element that is attached to the substrate (210) by emitting a laser beam, and for example, may include a passive element. The non-emission target element (212) refers to a semiconductor element that is attached to the substrate (210) by other means, because the non-emission target element (212) may experience thermal deformation due to the laser beam. The non-emission target element (212) may include an integrated circuit (IC) element. The IC element includes a touch IC, and a driver IC. The emission target element (211) and the non-emission target element (212) may be seated on the substrate (210) by an element seating unit (not shown) in section B2 in FIG. 2.

Referring to FIG. 1, the reel-to-reel laser reflow method according to an exemplary embodiment of the invention may further include the step of contacting a lower surface of the substrate (210) with an upper surface of a conveyor (231) for transferring the substrate (210), prior to or subsequent to S140. In the case where the substrate (210) is not in contact with the conveyor (231), an air gap may exist between the lower surface of the substrate (210) and the upper surface of the conveyor (231).

Figure 3:
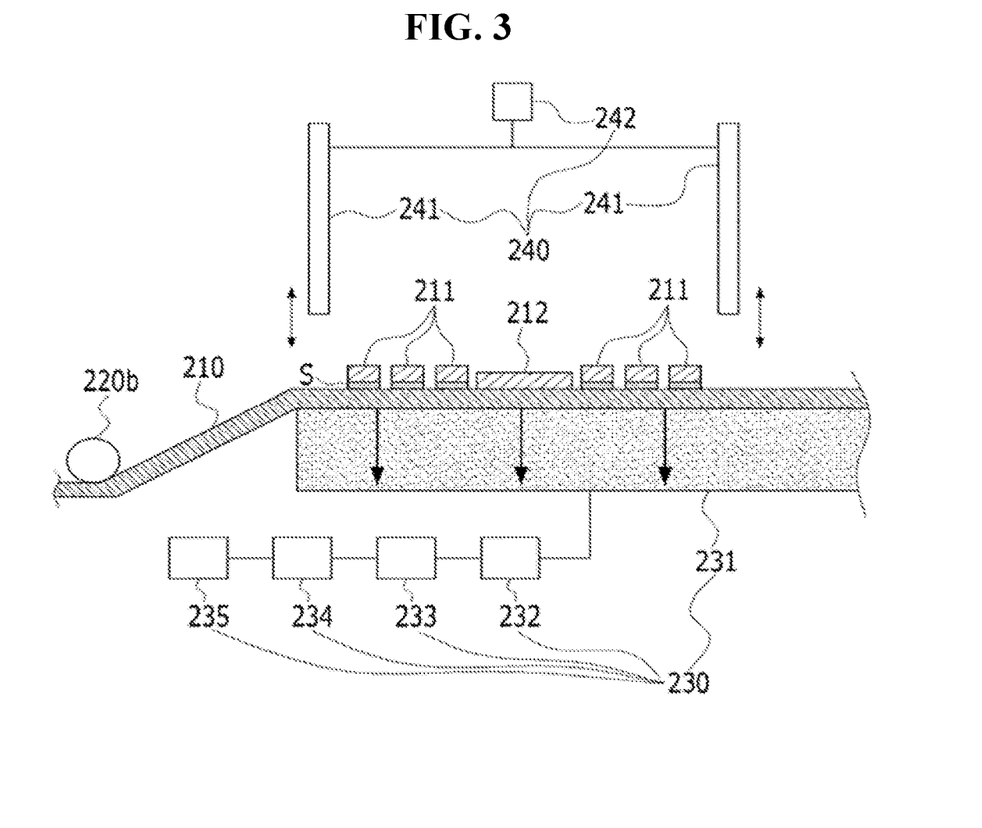
FIG. 3 is a view illustrating an example of the feature of bringing a substrate on which an emission target element and a non-emission target element are seated in contact with a conveyor.
Figure 5:
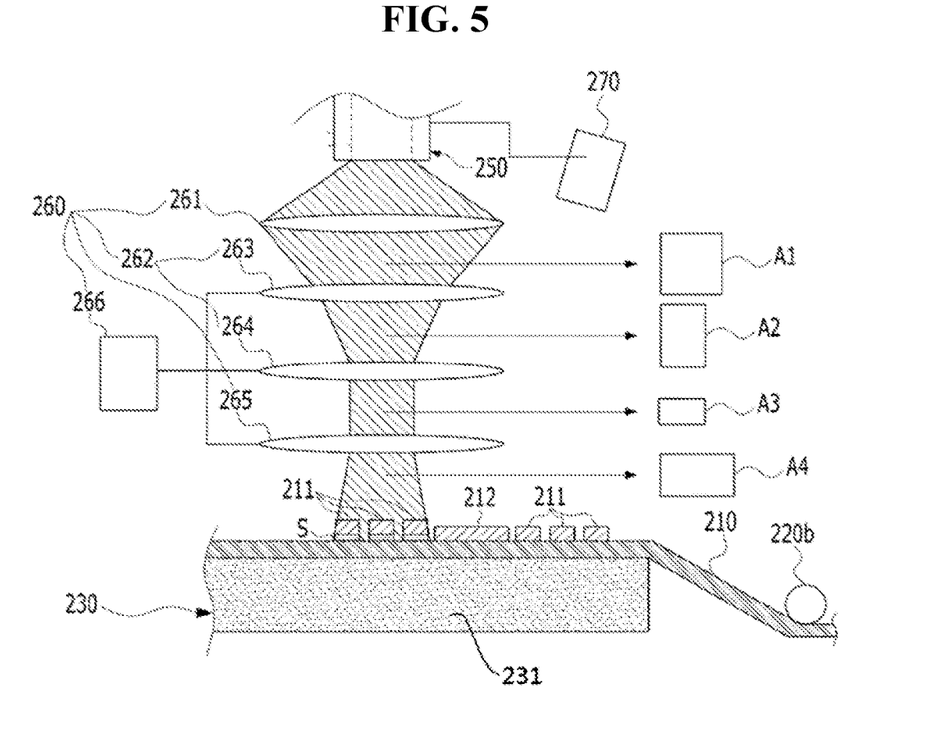
FIG. 5 is a view illustrating an example of the feature of attaching the emission target element to the substrate.

By way of example, a second reel (220b) shown in FIGS. 3 and 5 is mounted on opposite sides of the conveyor (231) in section B3 in FIG. 2, and is used to control the movement of the substrate (210). The second reel (220b) operates in conjunction with a transfer module (232), which will be described below, to move or suspend the substrate (210) so as to allow a laser beam to be sequentially emitted to the emission target element (211). The second reel (220b) may operate in conjunction with a first reel (220a) and a third reel (220c) to move in the same manner as the first and third reels. As the substrate (210) is pressed by the second reel (220b) at the opposite sides of the conveyor (231), the substrate (210) and the conveyor (231) are not in close contact with one another, such that an air gap may be generated between the substrate (210) and the conveyor (231). When a laser beam is emitted to the solder portion (S), part of the energy of the laser beam that has passed through the substrate (210) may not fully pass through the substrate (210) and remains in the air gap. In such case, the substrate (210) may experience thermal deformation due to the residual energy.

In S130 in FIG. 1, the substrate (210) may be transferred to an emission position of the laser beam by the transfer unit (230), with the substrate (210) contacting the conveyor (231). Referring to FIG. 3, the transfer unit (230) includes a conveyor (231) which may comprise the substrate (210) seated on an upper surface thereof and a transfer module (232) to feed a driving force to the second reel (220b) to move the substrate (210).

The conveyor (231) may refer to a body of the transfer unit (230) on which the substrate (210) is seated, and which transfers the substrate (210) to emission position of the laser beam. The transfer unit (230) may further include a vacuum module (233) to feed a vacuum pressure to allow an upper surface of the conveyor (231) to contact a lower surface of the substrate (210). The vacuum module (233) may be connected to the conveyor (231) to feed the vacuum pressure for allowing the lower surface of the substrate (210) to contact the conveyor (231). The conveyor (231) may include a porous vacuum chuck made of a ceramic material. The conveyor (231) including a porous vacuum chuck may include a plurality of minute cracks, and therefore, when the interior of the conveyor (231) is in a vacuum state by the vacuum module (233), the air above the upper surface of the conveyor (231) may pass through the interior of the conveyor (231) to move downwards. By this flow of air, the substrate (210) may be brought in closer contact with the upper surface of the conveyor (231).

During manufacturing, the substrate (210) may experience deformations such as warpage. Thus, when the substrate (210) is seated on the conveyor (231), part of a lower surface of the substrate (210) that is deformed may not be in full contact with the conveyor (231). A pressure contacting unit (240) may be mounted to allow the substrate (210) to contact the conveyor (231). The pressure contacting unit (240) includes a pressure rod (241) and a pressure control module (242). The pressure rod (241) may include a plurality of pressure rods above the conveyor (231), and may have a shape of a vertically extending cylinder. The shape of the pressure rod (241) is not limited to such an example. The pressure rod (241) may have any shape that allows the substrate (210) to contact the conveyor (231) by temporarily applying pressure to an upper surface of the substrate (210). The pressure control module (242) may move the pressure rod (241) in a horizontal direction to position the pressure rod (241) on an upper side of the substrate (210) where the substrate (210) and the conveyor (231) are not in contact with one another. The pressure control module (242) may be connected to the pressure rod (241) to move the pressure rod (241) to a lower side of the substrate (210). The pressure control module (242) may bring the substrate (210) to contact the conveyor (231) and then move the pressure rod (241) to the upper side. The pressure control module (242) may apply pressure to the upper surface of the substrate (210) and may apply pressure to a part of the substrate (210) where the solder portion (S) is not present.

In the case where a laser beam is emitted to the solder portion (S), with the upper surface of the substrate (210) contacting the upper surface of the conveyor (231), damage to the substrate (210) due to residual energy may be prevented as there would be no air gap generated between the conveyor (231) and the substrate (210).

The transfer unit (230) may further include a heater module (234) and a cooling module (235) provided in the conveyor (231). The heater module (234) and the cooling module (235) may adjust the temperature of the conveyor (231) to thereby effectively prevent the generation of thermal deformation to the substrate (210). The heater module (234) may comprise an infrared heater, and the cooling module (235) may include a cooler having a coolant. The cooling module (235) may also include a thermoelectric cooler.

The transfer module (232) moves the conveyor (231) to sequentially position the substrate (210) on emission positions. The transfer module (232) may control the second reel (220b) to allow the substrate (210) positioned on an emission position to linger for as long as a predetermined period of time in which a laser beam is emitted to the substrate (210).

Figure 4:
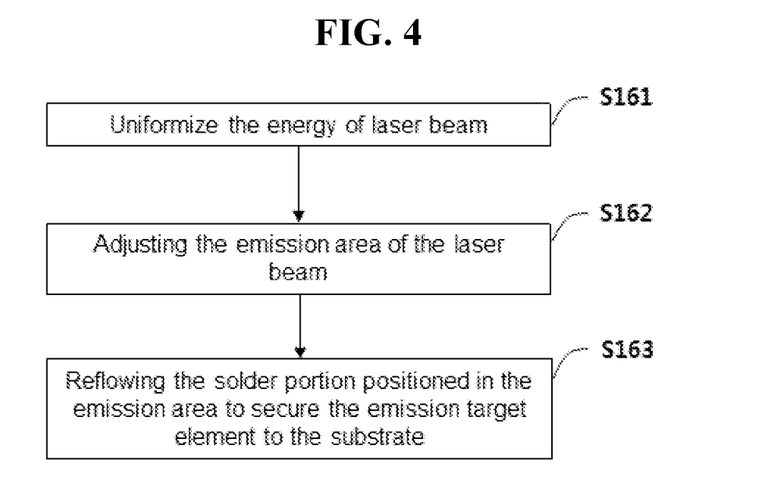
FIG. 4 is a flow chart illustrating the step of attaching the emission target element to the substrate.

Referring to FIGS. 1 and 5, the reel-to-reel laser reflow method according to an exemplary embodiment of the invention includes the step of emitting a square laser beam to the solder portion (S) on which an emission target element (211) is seated to thereby attach the emission target element (211) to the substrate (210) (S160). S160 may be carried out in section B3 in FIG. 2. In FIG. 4, S160 includes the step of uniformizing the energy of the laser beam (S161). In general, a laser beam has a Gaussian distribution wherein the energy of the laser beam decreases as being away from the center of the emission area. Accordingly, when a laser beam having a Gaussian function distribution is emitted to the solder portion (S) on which the emission target element (211) is seated, a central portion of the emission area may experience thermal deformation due to an excessive heat energy, and due to lack of energy necessary for reflow at an edge portion of the emission area, the emission target element (211) may not be secured to the substrate (210). Therefore, in S161, uniformization of energy may be performed in the emission area where the laser beam is emitted. Hereinafter, a process of uniformizing the energy of the laser beam having a Gaussian function distribution will be described.

According to an exemplary embodiment of the invention, a beam shaper (250) (see FIG. 5) is used to convert a laser beam in a Gaussian type to a surface light source having a uniformized energy distribution. Examples of the beam shaper are disclosed in Korean Patent Publication No. 10-1017848. For example, the beam shaper may include an optical fiber and a square light pipe for forming a uniformized square laser beam.

In FIG. 4, subsequent to S161, the step of adjusting the emission area of the laser beam (S161) may be carried out. The size and the shape of the emission target element (211) secured to the substrate (210) may vary depending on a semi-finished product. The substrate (210) may include a non-emission target element (212) seated thereon, in addition to the emission target element (211), and the non-emission target element (212) may easily experience thermal deformation due to the energy of the laser beam. Thus, in S162, in order to emit a laser beam that corresponds to the shape and size of the emission target element (211) seated on the substrate (210), an emission area of the laser beam may be adjusted. An emission area may refer to a surface area to which a laser beam is emitted, when radiating the laser beam to the emission target element (211). Hereinafter, a process of adjusting the emission area of the laser beam using an optical unit (260) will be described.

Referring to FIG. 5, the optical unit (260) may include a convex lens (261), a circumferential lens (262) and a focusing lens (265). The optical unit (260) is disposed at an outlet side of the beam shaper (250), and may adjust an emission area when a laser beam is emitted to a solder portion (S) on which the emission target element (211) is positioned. The convex lens (261) may be mounted adjacent to the outlet side of the beam shaper (250) that uniformizes the laser beam to condense the laser beam that is being surface-emitted. The laser beam may be dispersed when passing through the outlet side of the beam shaper (250). Thus, the convex lens (261) may condense the uniformized beam so as not to be dispersed, and may transmit the condensed laser beam to the circumferential lens (262). An emission area of the laser beam condensed by the convex lens (261) may have an identical shape as the shape of a core (251) through which the laser beam passes for uniformization. The emission area of the laser beam that has passed through the convex lens (261) may form a first emission area (A1). The convex lens (261) may be substituted with any lens capable of condensing a laser beam dispersed at an outlet side of the beam shaper (250).

The circumferential lens (262) includes a first cylindrical lens (263) and a second cylindrical lens (264), and may adjust the emission area of the laser beam that has passed through the convex lens (261) to have a predetermined shape. The first cylindrical lens (263) may adjust a length of the laser beam that has passed through the convex lens (261) in a first axis direction. The first cylindrical lens (263) may be mounted in the shape of a vertically rising cylinder that is cut along a transverse axis. The first cylindrical lens (263) may be provided below the convex lens (261), with a convex face of the first cylindrical lens (263) facing upwards. An emission area of the laser beam that passes through the first cylindrical lens (263) may be formed to have a length in the first axis direction decreasing. As the length of the laser beam that has passed through the first cylindrical lens (263) in the first axis direction decreases, the emission area may be transitioned from the first emission area (A1) to a second emission area (A2).

The second cylindrical lens (264) may adjust a length of the laser beam that has passed through the first cylindrical lens (263) in a second axis direction. The length of the laser beam in the second axis direction is at right angles with the length of the laser beam in the first axis direction. The second cylindrical lens (264) may be formed to have an identical shape as the shape of the first cylindrical lens (263). The second cylindrical lens (264) may be provided below the first cylindrical lens (263), with a convex face of the second cylindrical lens (264) facing upwards. The second cylindrical lens (264) may be provided at right angles with the first cylindrical lens (263). An emission area of the laser beam that passes through the second cylindrical lens (264) may be formed to have a length in the second axis direction decreasing. As the length of the laser beam that has passed through the second cylindrical lens (264) in the second axis direction decreases, the emission area may be transitioned from the second emission area (A2) to a third emission area (A3).

The first cylindrical lens (263) and the second cylindrical lens (264) may readily adjust the shape of the emission area of the laser. The first cylindrical lens (263) and the second cylindrical lens (264) are not limited to an example, and may comprise any elements capable of readily adjusting the length of the emission area in the first axis direction and the length of the emission area in the second axis direction. The first cylindrical lens (263) and the second cylindrical lens (264) may be disposed to allow a convex face thereof to face downwards, and a lens with a convex upper face may be mounted at the positions of the first cylindrical lens (263) and the second cylindrical lens (264). The emission area of the laser beam may be adjusted to increase the length in the first axis direction and the length in the second axis direction. The first cylindrical lens (263) and the second cylindrical lens (264) may comprise any examples capable of adjusting a length ratio between the transverse length and the longitudinal length of the emission area by adjusting the length of the emission area of the laser beam in the first axis direction and the length of the emission area of the laser in the second axis direction.

The first cylindrical lens (263) and the second cylindrical lens (264) may switch their positions. Specifically, by allowing the laser that has passed through the convex lens (261) to transmit the second cylindrical lens (264) before transmitting the first cylindrical lens (263, the length of the emission area in the first axis direction may be adjusted after the length of the emission area in the second axis direction is adjusted.

The focusing lens (265) controls the emission area of the laser that has passed through the circumferential lens (262) to have a predetermined surface area. The focusing lens (265) may increase or decrease the surface area of the emission area, while maintaining the shape of the emission area formed by the circumferential lens (262). The focusing lens (265) may increase or decrease the surface area of the emission area, in a state where the shape of the emission area is maintained by maintaining a ratio of the length in the second axis direction to the length in the first axis direction in the emission area formed by the circumferential lens (262). By expanding the third emission area (A3), which is the emission area of the laser beam that has passed through the second cylindrical lens (264), using the focusing lens (265), the third emission area (A3) may have a surface area of a fourth emission area (A4). The focusing lens (265) may also reduce the surface area of the third emission area (A3). The focusing lens (265) may be provided as a replaceable element.

In FIG. 5, the optical unit (260) may further include a lifting module (266). The lifting module (266) may adjust an emission area of a laser beam by lifting or lowering the first cylindrical lens (263), the second cylindrical lens (264) and the focusing lens (265). The lifting module (266) may adjust the length of the emission area in the first axis direction when the first emission area (A1) is transitioned into the second emission area (A2) by lifting or lowering the first cylindrical lens (263). As the first cylindrical lens (263) is lifted higher, the length of the second emission area (A2) in the first axis direction considerably decreases, and as the first cylindrical lens (263) is lowered, the length of the second emission area (A2) in the second axis direction decreases slightly. The lifting module (266) may adjust the length of the emission area in the second axis direction when the second emission area (A2) is transitioned into the third emission area (A3) by lifting or lowering the second cylindrical lens (264). In transition of the third emission area (A3) into a fourth emission area (A4), the lifting module (266) may adjust the surface area of the fourth emission area (A4) by lifting or lowering the focusing lens (265). In a similar manner, the length of the emission area in the second axis direction may be adjusted by lifting or lowering the second cylindrical lens (264), and the surface area of the emission area may be adjusted by lifting or lowering the focusing lens (265).

In FIG. 4, subsequent to S162, the step of securing the emission target element (211) to the substrate (210) by reflowing the solder portion (S) positioned within the emission area by a lase beam is performed (S163). In S162, The laser beam uniformized in S161 passes through the optical unit (260) thereby adjusting the emission area, and the laser beam with the adjusted emission area is emitted to the solder portion (S) on which the emission target element (211) is seated in S163, thereby securing the substrate (210) and the emission target element (211). The laser beam emitted to the emission target element (211) passes through the emission target element (211) and the substrate (210), and reflows the solder portion (S). When the solder portion (S) is reflowed, the emission target element (211) and the substrate (210) are attached to one another, such that the substrate (210) and the emission target element (211) are electrically connected.

The reel-to-reel laser reflow method according to an exemplary embodiment of the invention may attach the emission target element (211) to the substrate (210) by radiating the laser beam for one to two seconds. Consequently, the reel-to-reel laser reflow method according to an exemplary embodiment of the invention can manufacture a substrate structure (280) at a higher speed than prior art, thus increasing productivity.

Conventionally, an emission target element (211) and a non-emission target element (212) need to be separately attached to two different substrates (210), and then the substrate attached with the emission target element (211) and the substrate attached with the non-emission target element (212) are combined, and therefore, a substrate structure (280) would have a great thickness and accordingly, a semi-finished product would also have a great thickness. However, according to an exemplary embodiment of the invention, the reel-to-reel laser reflow method includes attaching the emission target element (211) and the non-emission target element (212) to a single substrate (210), and thus, the thickness of the substrate structure (280) can be reduced.

In S163, at least one measurement location may be set within an emission area. A temperature of a solder portion (S) positioned at the measurement location may be measured in real time. For example, the temperature of the solder portion (S) may be measured in real time by a temperature measurement unit (270) disposed above the transfer unit (230). The temperature measurement unit (270) may include an infrared camera or a heat detection camera, etc. The temperature measurement unit (270) may control the level of energy of a laser beam so that a solder portion (S) positioned at the measurement location maintains a predetermined normal range of temperature. In the case where the temperature of the solder portion (S) positioned at the measurement location deviates the predetermined normal range of temperature, a notification is sent to a user to inform the occurrence of defect in order to reduce a defect rate of semi-finished products.

In FIG. 1, the step of attaching the non-emission target element (212) to the substrate (210) may further be performed (S150), prior to or subsequent to S160. In a conventional mass reflow process, in the case of emitting a laser beam to the substrate (210) in a state where the non-emission target element (212) is attached to the substrate (210), thermal deformation may occur in the non-emission target element (212). Moreover, in the case of attaching the non-emission target element (212) to the substrate (210) after attaching the emission target element (211) to the substrate (210), a problem would arise due to the thermal deformation on the substrate (210) as the non-emission target element (212) is attached to the substrate (210) without having an optimized pitch. However, since the reel-to-reel laser reflow method according to an exemplary embodiment of the invention can radiate a laser beam only to a position of the emission target element (211), whether the laser beam is emitted to the emission target element (211) prior to or subsequent to the attachment of the non-emission target element (212) to the substrate (210), no defects would occur. Therefore, S150 may be performed by an additional bonding device (not shown) prior to or subsequent to S160 depending on the conditions. Also, the non-emission target element (212) may be attached to the substrate (210) simultaneously with the emission target element (211) being attached to the substrate (210).

In FIG. 1, the reel-to-reel laser reflow method according to an exemplary embodiment of the invention may perform the step of inspecting the substrate structure (280) manufactured through S160 (S170). The substrate structure (280) includes a substrate (210), an emission target element (211) attached to the substrate (210) and a non-emission target element (212). The substrate structure (280) may be inspected to detect whether there is a thermal deformation upon emission of the laser beam, and to determine whether the emission target element (211) and the non-emission target element (212) attached to the substrate structure (280) are attached to predetermined positions. Furthermore, marking may be performed on a substrate structure (280) that is determined to have a defect. The marked substrate structure (280) may be excluded from a subsequent process.

Figure 6:
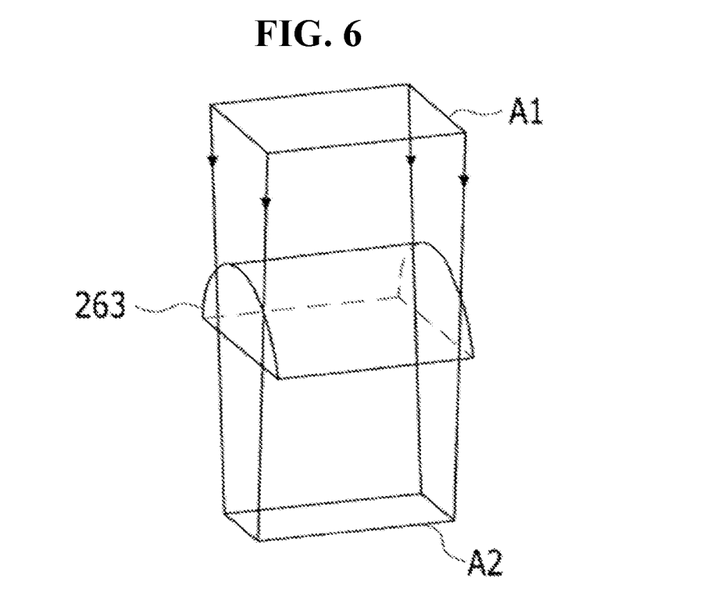
FIGS. 6 and 7 are views illustrating examples of a first cylindrical lens and a second cylindrical lens.
Figure 7:
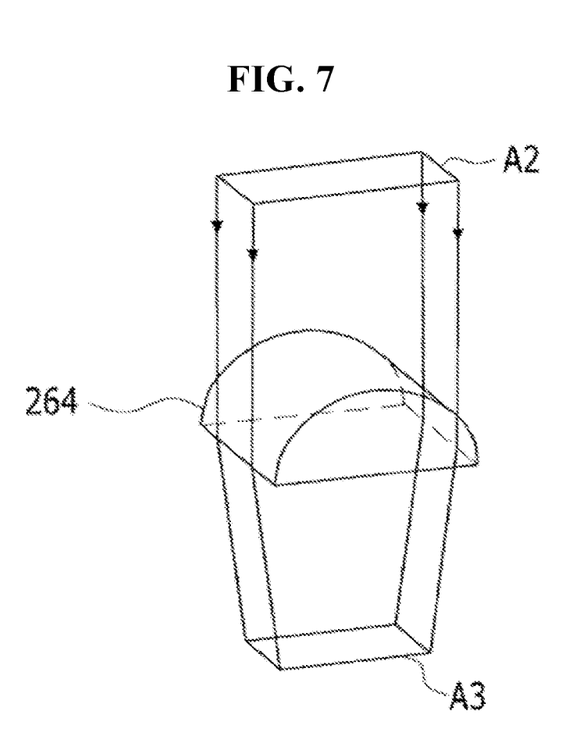

In FIG. 1, subsequent to S170, the reel-to-reel laser reflow method according to an exemplary embodiment of the invention may perform the step of winding the substrate structure in a roll type (S180). A third reel (220c) is mounted downstream of section B4 in FIG. 2. The third reel (220c) may wind the substrate structure (280) in a roll type. The reel-to-reel laser reflow method according to an exemplary embodiment of the invention performs a series of steps from the first reel (220a) to the third reel (220c), to finally produce the substrate structure (280) in a roll type, thereby reducing a process time and facilitating transport, providing an economically efficient method. FIGS. 6 and 7 are views illustrating examples of a first cylindrical lens and a second cylindrical lens.

DRAWING REFERENCE NUMERALS

210: substrate
211: emission target element
212: non-emission target element
220a: first reel
220b: second reel
220c: third reel
230: transfer unit
231: conveyor
232: transfer module
233: vacuum module
234: heater module
235: heater module
240: pressure contacting unit
241: pressure rod
242: pressure control module
250: beam shaper
260: optical unit
261: convex lens
262: circumferential lens
263: first cylindrical lens
264: second cylindrical lens
265: focusing lens
266: lifting module
270: temperature measurement unit
280: substrate structure

MODE(S) FOR CARRYING OUT THE INVENTION

As described in the foregoing, modes for carrying out the invention are provided in an optimal way to carry out the invention.

INDUSTRIAL APPLICABILITY

Description according to the present application is applicable to a laser reflow device.

The invention claimed is:
1. A reel-to-reel laser reflow device, the device comprising:
a first reel to unwind a substrate wound in a roll type;
a transfer unit to transfer the substrate unwound by the first reel;
a pressure contacting unit to apply pressure to the substrate to bring the substrate to contact the transfer unit;
a second reel to control a movement of the substrate;
a solder forming unit to form a solder portion on the substrate;
an element seating unit to seat an emission target element on the solder portion and seat a non-emission target element on the substrate;
an optical unit to adjust an emission area of a laser beam so that a uniformized laser beam is emitted only to the emission target element seated on the solder portion;
an inspection unit to inspect the substrate structure attached with the emission target element seated on the solder portion; and
a third reel to wind the substrate structure that has passed through the inspection unit;
wherein the transfer unit comprises:
a conveyor on which the substrate is seated;
a transfer module to feed a driving force to the second reel to thereby move the substrate to one side;

a vacuum module to apply a vacuum pressure to bring a lower surface of the substrate in contact with an upper surface of the conveyor for transferring the substrate; and wherein the optical unit uniformizes the laser beam's energy, adjusts the laser beam's emission area, and emits the laser beam to reflow the solder portion positioned within the emission area to secure the emission target element to the substrate.

2. The device according to claim 1, wherein the transfer unit further comprises a heater module and a cooling module for adjusting the temperature of the conveyor.

3. The device according to claim 1, wherein the pressure contacting unit comprises:
   a pressure rod mounted above the conveyor; and
   a pressure control module to control the pressure rod to move in longitudinal and transverse directions.

4. The device according to claim 1, wherein the solder forming unit comprises a screen printer to screen-print a solder paste on the substrate.

5. The device according to claim 1, wherein the optical unit comprises:
   a beam shaper to convert a laser beam in a Gaussian type emitted from a laser unit to a surface light source having a uniformized energy distribution;
   a convex lens to condense the laser beam output from the beam shaper;
   a first cylindrical lens to adjust a length of the laser beam that has passed through the convex lens in a first axis direction;
   a second cylindrical lens to adjust the length of the laser beam that has passed through the first cylindrical lens in a second axis direction;
   a focusing lens to allow the emission area of the laser beam that has passed through the second cylindrical lens to have a predetermined surface area; and
   a lifting module to adjust the emission area of the laser beam by lifting or lowering the first cylindrical lens, the second cylindrical lens, and the focusing lens individually.

* * * * *